United States Patent [19]

Saari

[11] Patent Number: 4,476,448
[45] Date of Patent: Oct. 9, 1984

[54] SWITCHED CAPACITOR HIGH-PASS FILTER

[75] Inventor: Veikko R. Saari, Spring Lake Heights, N.J.

[73] Assignee: AT&T Bell Laboratories, Murray Hill, N.J.

[21] Appl. No.: 414,012

[22] Filed: Sep. 2, 1982

[51] Int. Cl.³ .................... H03H 19/00; H03H 7/48
[52] U.S. Cl. ................................ 333/173; 307/523; 328/151
[58] Field of Search .......................... 333/165–167, 333/173, 172; 307/520–523, 527; 328/167, 151

[56] References Cited

U.S. PATENT DOCUMENTS 3,526,858  9/1970  Heinlein et al. .................. 333/173
3,531,741  9/1970  Langer ............................. 333/173

*Primary Examiner*—Marvin L. Nussbaum
*Attorney, Agent, or Firm*—Volker R. Ulbrich

[57] ABSTRACT

A switched capacitor MOS high-pass filter (10) includes a blocking capacitor ($C_1$) which accepts an input signal at one side (IN). A first electronic toggle switch ($S_1$) connects the gate of a depletion-mode buffer transistor ($T_1$) alternately to the other side of the blocking capacitor ($C_1$) and to ground in response to a pair of non-overlapping switching pulse trains ($\phi_1$), ($\phi_2$). A depletion-mode transistor ($T_2$) provides current to the buffer transistor ($T_1$). One side of an output capacitor ($C_2$) is connected to the source of the buffer transistor ($T_1$). A second toggle switch ($S_2$) connects the other side of the output capacitor ($C_2$) alternately to an output terminal (OUT) and to ground.

Also disclosed is a filter (14) which includes a correction network (18) to eliminate from the output signal the effect of a feed-through error voltage generated by the action of the first switch ($S_1$).

6 Claims, 4 Drawing Figures

SWITCHED CAPACITOR HIGH-PASS FILTER

BACKGROUND OF THE INVENTION

The invention relates generally to frequency domain high-pass electronic filters and relates more particularly to precision switched capacitor filters for integrated circuits.

A known basic high-pass frequency domain filter is shown in FIG. 1. It includes a signal input terminal, a d.c. (direct current) blocking capacitor C, a resistor R, and a signal output terminal such as would typically be connected to the summing node of a negative feedback amplifier. The reference symbol C, as is used herein with different subscripts to identify particular capacitors, is also used to denote the capacitance value of that capacitor.

In very large scale integrated MOS (metal-oxide-silicon) circuits, it is generally not feasible to provide either a precision resistor for R or to provide a capacitor whose value tracks the inverse of the resistor value over variations in the manufacturing process. The resistor R can, however, be replaced by a capacitor $C_2$, which is switched by a pair of break-before-make electronic toggle switches $S_1$, $S_2$ operated by non-overlapping switching pulse trains $\phi_1$, $\phi_2$ to result in the known switched capacitor filter structure of FIG. 2. The value of the capacitor $C_2$ corresponding to the resistance value of resistor R is $1/C_2 f_s$, where $f_s$ is the frequency of the switching pulse trains. It is noted that larger $C_1$ capacitance values correspond to lower break frequencies for such a filter. The break frequency of a filter is that frequency associated with the knee of the transmission characteristic curve for that filter.

One problem with the switched capacitor filter structure of the type shown in FIG. 2 is that for a given capacitor value $C_2$, as required for output drive, and a given switching pulse rate for the electronic switches $S_1$, $S_2$, a relatively large value is required for the capacitance $C_1$ in order to obtain relatively low break frequency capability. This is because a lower limit on the value of the capacitance $C_2$ is determined by the nature of the load circuitry. Large capacitance value elements require additional area on the integrated circuit chip. Furthermore, requiring the signal source to supply all of the current required to charge $C_2$ may also lead to significant additional cost.

Another problem relates to a parasitic capacitance $C_X$, shown in phantom lines in FIG. 2, which is present on the switch $S_1$ side of the capacitance of $C_2$ in the prior art circuit. This additional switched capacitance is troublesome in that it is generally voltage-dependent, and introduces non-linear transmission loss which may be significant.

While a lower break frequency capability could also be obtained for the prior art structure by lowering the frequency of the switching pulses for the switches $S_1$, $S_2$, this would cause problems in realizing other circuit functions on the chip, assuming that it is the main clock frequency that is lowered; it might also create new antialiasing problems if the switching pulses represent a further count-down from the main clock.

SUMMARY OF THE INVENTION

The switched capacitor high-pass filter structure in accordance with the present invention includes a buffer means which makes it possible to obtain a given break frequency for given switching frequency and transadmittance capability with a relatively low input blocking capacitance value. The buffer also increases the input impedance and thereby reduces the stress on the input circuitry.

DETAILED DESCRIPTION

Figure 3:
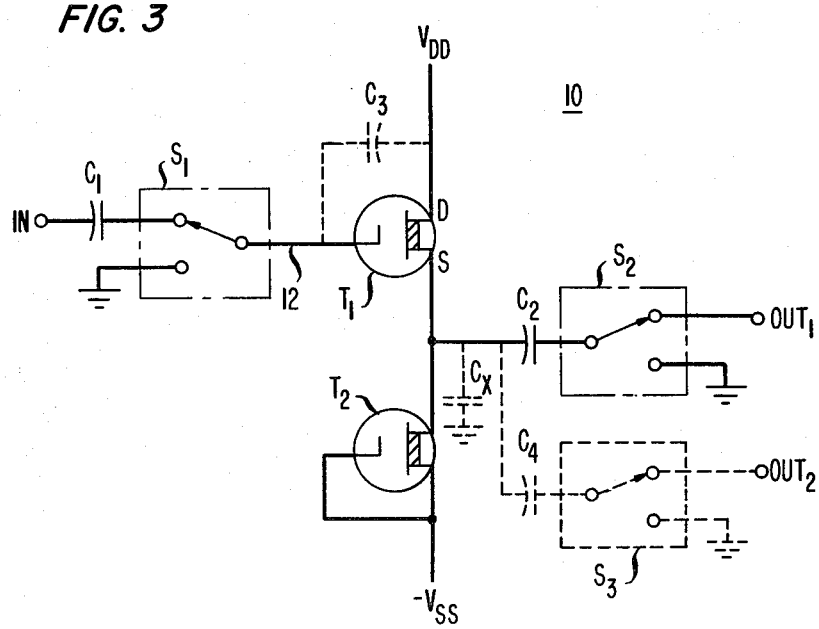
FIG. 3 is a schematic circuit diagram of one example of a switched capacitor high-pass filter in accordance with the present invention.

The filter 10 of FIG. 3 includes a d.c. blocking capacitor $C_1$ receiving an input signal voltage from an input terminal IN. The other side of the blocking capacitor $C_1$ is connected through a switch $S_1$ operated at rate $f_s$ to the gate electrode of an MOS buffer transistor $T_1$. The drain of the buffer transistor $T_1$ is connected to a stable voltage supply $V_{DD}$. The source of the buffer transistor $T_1$ is connected to a current source, shown as depletion-mode transistor $T_2$, which in turn has its source and gate connected to a relatively negative voltage supply $-V_{SS}$. An output capacitor $C_2$ is coupled at one side to the source of the buffer transistor $T_1$ and at its other side to an output terminal $OUT_1$ through a second switch $S_2$. It is advantageous to make the source-follower transistor $T_1$ a depletion-mode device also, to avoid a substantial d.c. voltage level shift, which would reduce the signal range of linearity.

The switches $S_1$ and $S_2$ are single pole break-before-make toggle switches which may be configured readily in numerous ways with MOS FET (metal-oxide-silicon field effect transistor) devices and operated by separate switching pulse trains $\phi_1$ and $\phi_2$ which do not overlap. The switches $S_1$, $S_2$ are shown in their $\phi_1$ switching phase state in all the figures of the drawings. In the $\phi_2$ phase condition they would be in their alternate state.

The switch $S_1$ connects the gate of the buffer transistor $T_1$ alternately to the blocking capacitor $C_1$ and signal ground. The second switch $S_2$ connects the output side of the capacitor $C_2$ alternately between the $OUT_1$ terminal and signal ground.

Figure 1:
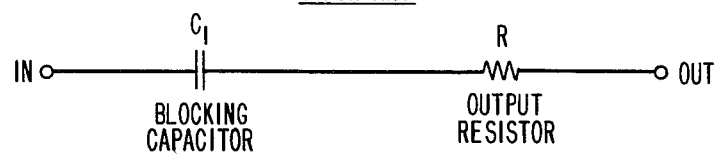
FIG. 1 is a schematic circuit diagram of a prior art basic high-pass filter.
Figure 2:
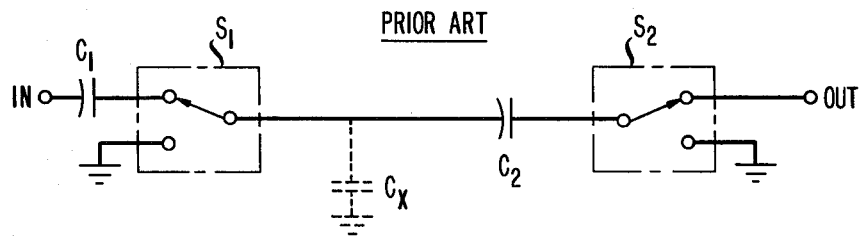
FIG. 2 is a schematic circuit diagram of a prior art switched capacitor version of the high-pass filter of FIG. 1.

There is shown in phantom lines in FIG. 2 a capacitor $C_3$ which represents the gate-to-drain capacitance of the blocking transistor $T_1$ plus the parasitic capacitance of switch $S_1$. It is a particularly advantageous feature of the filter 10 that the switched capacitance that determines the load resistance terminating $C_1$ can be limited to the relatively low value $C_3$, resulting in a relatively high equivalent resistance value and either a relatively low break frequency or low $C_1$ value.

Also shown in phantom lines in FIG. 2 is a second output branch condition capacitor $C_4$ connected through a third toggle switch $S_3$ to an additional output terminal to illustrate that a plurality of outputs may be derived from the source of the buffer transistor $T_1$, as desired, by providing additional capacitors and switch pairs.

While, of course, the specific values of the capacitors $C_1$, $C_2$, $C_3$, $C_4$, etc. for a particular application of the filter 10 must be appropriately chosen in view of the switching pulse rate and other considerations, the blocking capacitor $C_1$ is assumed to be large enough that its charge does not change appreciably over the period of the lowest signal frequency component that must be passed by the filter 10 in order for it to have a loss level as low as is needed above the break frequency.

MODE OF OPERATION

In the operation of the filter 10, the relatively small capacitance $C_3$ toggled between the output end of the relatively large input capacitance $C_1$ and the reference voltage (ground) slowly leaks away signal charge that resides on the right-hand plate of the input capacitor $C_1$. Signal frequency components below a break frequency determined by the capacitance values $C_1$, $C_3$ and the switching rate $f_s$ are substantially shorted to ground. The toggle switch $S_1$ also serves as the left-hand toggle of the capacitors $C_3$ and $C_4$. The first and second output branches would typically be expected to act as input resistors to amplifiers (not shown). The "buffer" transistor $T_1$, which is a source follower large enough to be able to fully charge its load during the conducting time period of the switches $S_1$, $S_2$, transfers its gate voltage variations unattenuated to the left-hand terminals of the capacitors $C_2$ and $C_4$. As a practical matter, the nonlinear parasitic capacitance $C_X$ to ground from the node at which the source of the buffer transistor $T_1$ joins capacitor $C_2$ is immaterial, as is also the d.c. voltage level at that node, except for its effect on signal voltage range. The d.c. voltage level at the source of the buffer transistor $T_1$ has no material effect on output offset.

In the operation of the filter 10, the switching of the control voltage of the switch $S_1$ between its low and high logic levels results in a switching feed-through error, which is characteristic of MOS devices. In effect, it means that the voltage at the node 12 includes an error voltage $V_{error}$ in the $\phi_1$ phase, so that the node 12 voltage jumps from ground the settle to a value $$C_1/C_1 + C_3 \, V_{signal} + V_{error}$$

in the $\phi_1$ phase. In the $\phi_2$ phase it jumps back to ground or 0 volts. While this error is very small, for some applications of the filter 10 it may be desirable to eliminate it.

Figure 4:
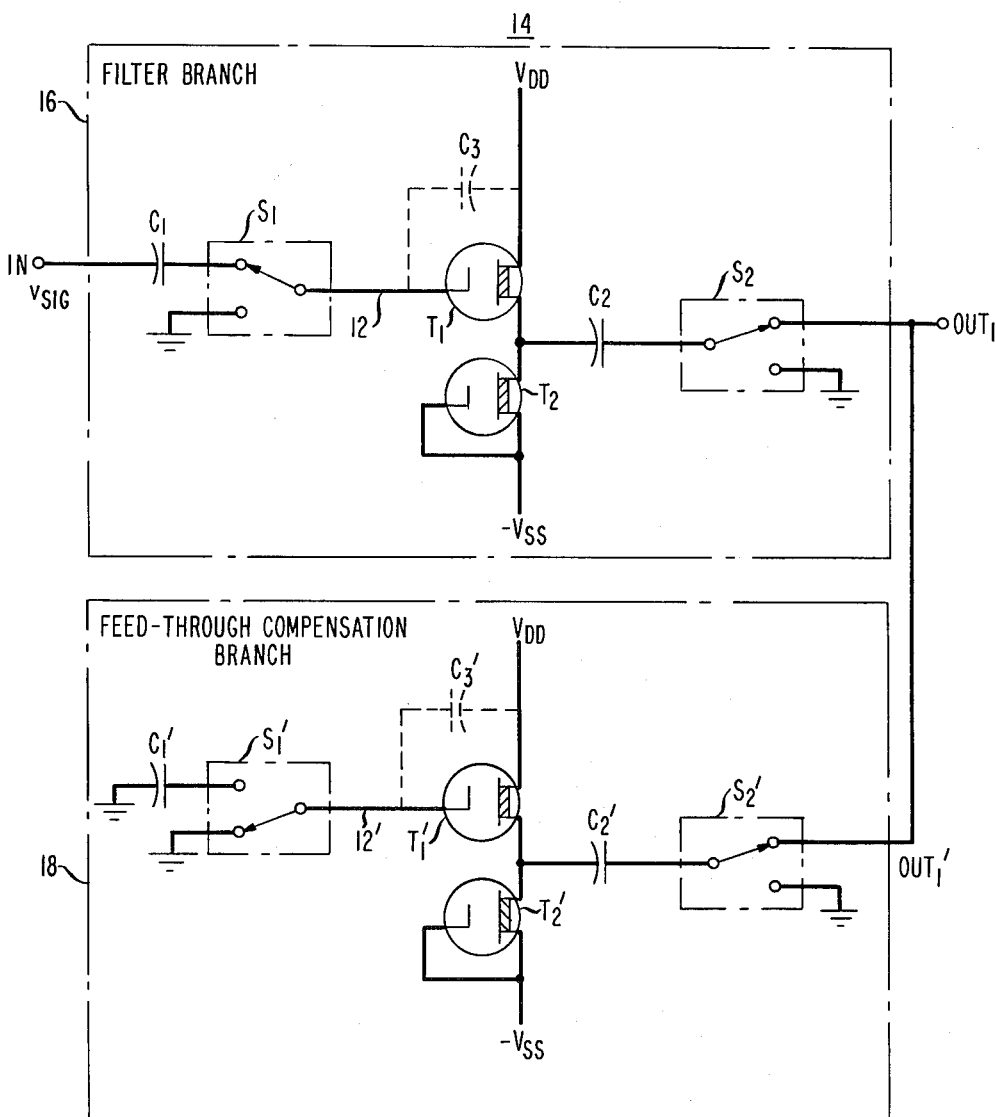
FIG. 4 is a schematic circuit diagram of another example of a switched capacitor high-pass filter in accordance with the present invention and including an error correction branch.

Another example of a filter in accordance with the invention is the filter 14 of FIG. 4, which is a form of the filter 10 of FIG. 3 modified to include means for compensating in the output signal for the effect of the above-described feed-through error voltage $V_{error}$. The modified filter 14 includes an upper, filter branch 16 and a lower, compensation branch 18, both enclosed by broken line rectangles. The filter branch 16 can be seen to be virtually identical to the filter 10 of FIG. 3, and is therefore shown with the same reference symbols as appeared for the corresponding elements in FIG. 3. The compensation branch 18 is similar to the filter branch 16 in its configuration and in the characteristics of its components, but has its IN terminal is connected to the $OUT_1$ terminal grounded. Its $OUT'_1$ terminal of the filter branch 16. The circuit elements are identified by primed reference symbols of corresponding elements in the upper, filter branch 16. It is noted that the switching of the switch $S'_1$ of the compensation branch 18 is substantially 180 degrees out of phase with the switching of $S_1$ of the filter branch 16. However, the same d.c. voltage error $V_{error}$ is developed at node 20 as is developed at node 18. Since the gate of buffer transistor $T'_1$ jumps from a voltage value $V_{error}$ to ground in the $\phi_1$ phase, the compensation branch 18 feeds to the output node only a switching feed-through correction charge which is opposite in sign to, but precisely the same magnitude as, the error charge (due to $V_{error}$) fed to the $OUT_1$ node of the filter branch 16 in the $\phi_1$ phase. Since the outputs of the branches 16 and 18 are combined, this leads to a complete cancellation of the error in the $OUT_1$ terminal.

GENERAL CONSIDERATIONS

The current source for the buffer $T_1$ can be any of various current source configurations, such as for example, a current mirror configuration.

The function of the buffer transistor $T_1$ can be provided by a depletion or enhancement mode FET device or by an operational or other amplifier. In the case of the buffer transistor $T_1$, the node 12 corresponds to a buffer input port and the source corresponds to a buffer output port.

The filter of FIG. 4 may also be provided with a plurality of OUT terminals in a manner similar to that discussed above with respect to the filter 10 of FIG. 3.

The capacitance $C_3$ may also include a relatively stable supplemental capacitance added by design to the gate-to-drain capacitance of transistor $T_1$ to obtain a filter with less amplitude distortion.

The term "ground" as used herein means a reference potential which is essentially constant. While in the FIGS. 2, 3, and 4 the same commonly used symbol is used to denote such a potential at various points in the circuits, it should be understood that the various such potentials for a given circuit need not necessarily be the same.

What is claimed is:

1. A switched capacitor filter, comprising:
   a first capacitor for receiving an input at one side;
   a buffer amplifier means having an input port and an output port;
   a first toggle switch means responsive to a switching pulse train to connect said input port alternately to a reference potential and to the other side of said first capacitor;
   a second capacitor connected at one side to said buffer output port; and
   a second toggle switch means responsive to a second switching pulse train to connect the other side of said second capacitor alternately to a reference potential and to an output terminal.

2. The filter defined in claim 1 wherein said buffer means comprises a field effect buffer transistor having its drain connected to a first polarity supply voltage source and its source connected to a current source means, said input port of said buffer transistor being the gate electrode and said output port being the source electrode.

3. The filter defined in claim 2 wherein said current source means comprises a depletion-mode field-effect current source transistor having its drain connected to the source of said buffer transistor and its source and gate connected to a second polarity power supply voltage.

4. The filter defined in claim 1 comprising a plurality of output capacitors, each connected at one side to said output port of said buffer means and each connected at the other side to a separately associated switch means responsive to a switching pulse train to connect the other side alternately between a reference potential and a separately associated output terminal.

5. The filter defined in claim 1 as a first, filter branch and including additionally a second switching feedthrough error compensation branch, said second branch comprising:
- a first capacitor connected to a reference potential at one side;
- a buffer means having an input port and an output port;
- a first switch means responsive to a first switching pulse train to connect said input port alternately to a reference potential and to the other side of said first capacitor, said first toggle switch means being operated 180 degrees out of phase with said first toggle switch of said filter branch;
- a second capacitor connected at one side to said buffer output port of said buffer; and
- a second toggle switch means responsive to a second switching pulse train, nonoverlapping said first pulse train, to connect the other side of said second capacitor alternately to a reference potential and said output terminal of said filter.

6. The filter defined in claim 1 comprising an additional capacitor connected between said input port and a reference voltage.

* * * * *